United States Patent [19]
Lovendusky et al.

[11] 3,938,245
[45] Feb. 17, 1976

[54] TERMINAL APPLICATOR

[75] Inventors: Charles Michael Lovendusky, Enola; Charles William Wallick, York, both of Pa.

[73] Assignee: E. I. Du Pont de Nemours & Company, Wilmington, Del.

[22] Filed: July 23, 1974

[21] Appl. No.: 491,045

[52] U.S. Cl. .............. 29/626; 29/203 B; 29/525; 227/2; 227/4
[51] Int. Cl.² ........................................ H05K 13/04
[58] Field of Search ...... 29/625, 626, 203 R, 203 B, 29/203 DS, 203 DT, 203 P, 208 R, 208 C, 208 E, 208 D, 208 H, 211 R, 525; 227/2, 4–7

[56] References Cited
UNITED STATES PATENTS

| | | | |
|---|---|---|---|
| 3,664,015 | 5/1972 | Bakermans | 29/203 B X |
| 3,763,540 | 10/1973 | Long | 29/203 B |
| 3,797,091 | 3/1974 | Gavin | 29/203 B |
| 3,837,063 | 12/1974 | Wright | 29/203 B |

Primary Examiner—C. W. Lanham
Assistant Examiner—Joseph A. Walkowski

[57] ABSTRACT

An applicator is provided for inserting a terminal in a hole in a circuit board comprising terminal insertion tooling, having an elongated insertion blade and a pair of preloaded spring fingers, and an anvil including a retractable locating and gauging pin surrounded by an actuator collar. A hole in a circuit board is positioned on the locator pin and the circuit board depressed against the actuator collar. The locating pin is retracted. A ram extends the terminal insertion tooling. The preloaded spring fingers hold the terminal in alignment with a hole in the circuit board and the tool inserts the terminal into the hole. The insertion tool is then retracted and the retractable locating pin is extended to permit positioning of another circuit board hole on the locating pin and subsequent insertion of another terminal.

19 Claims, 14 Drawing Figures

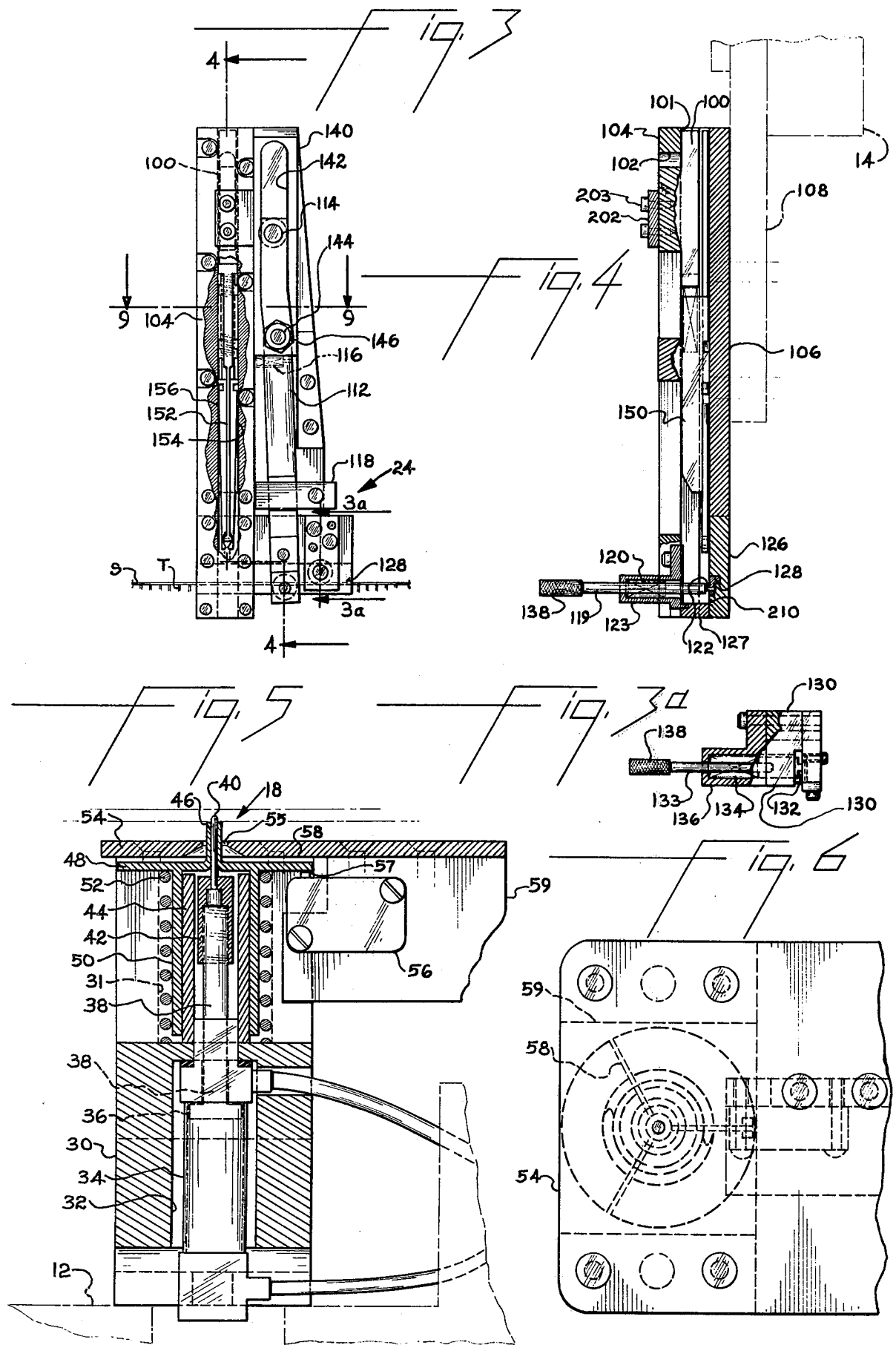

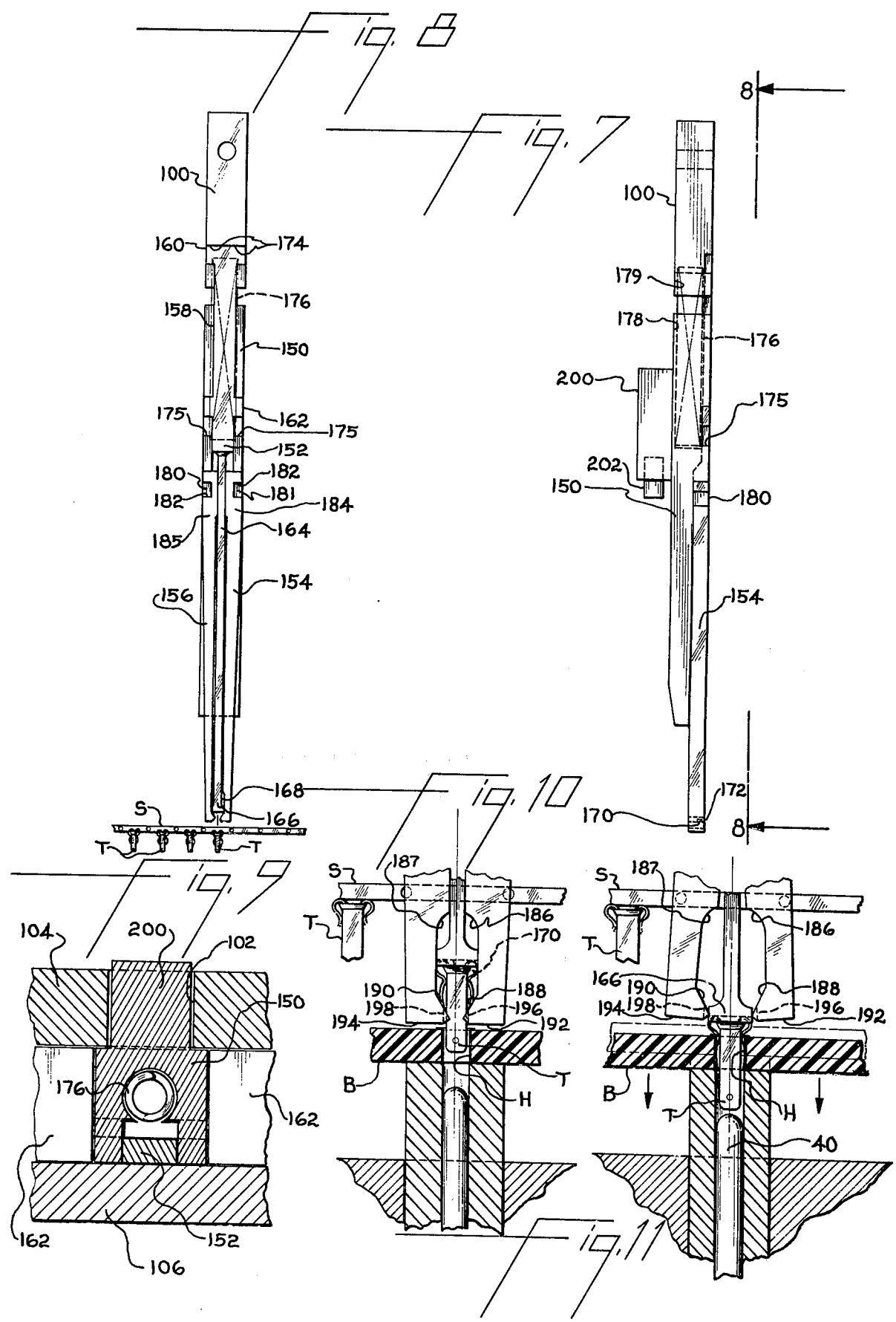

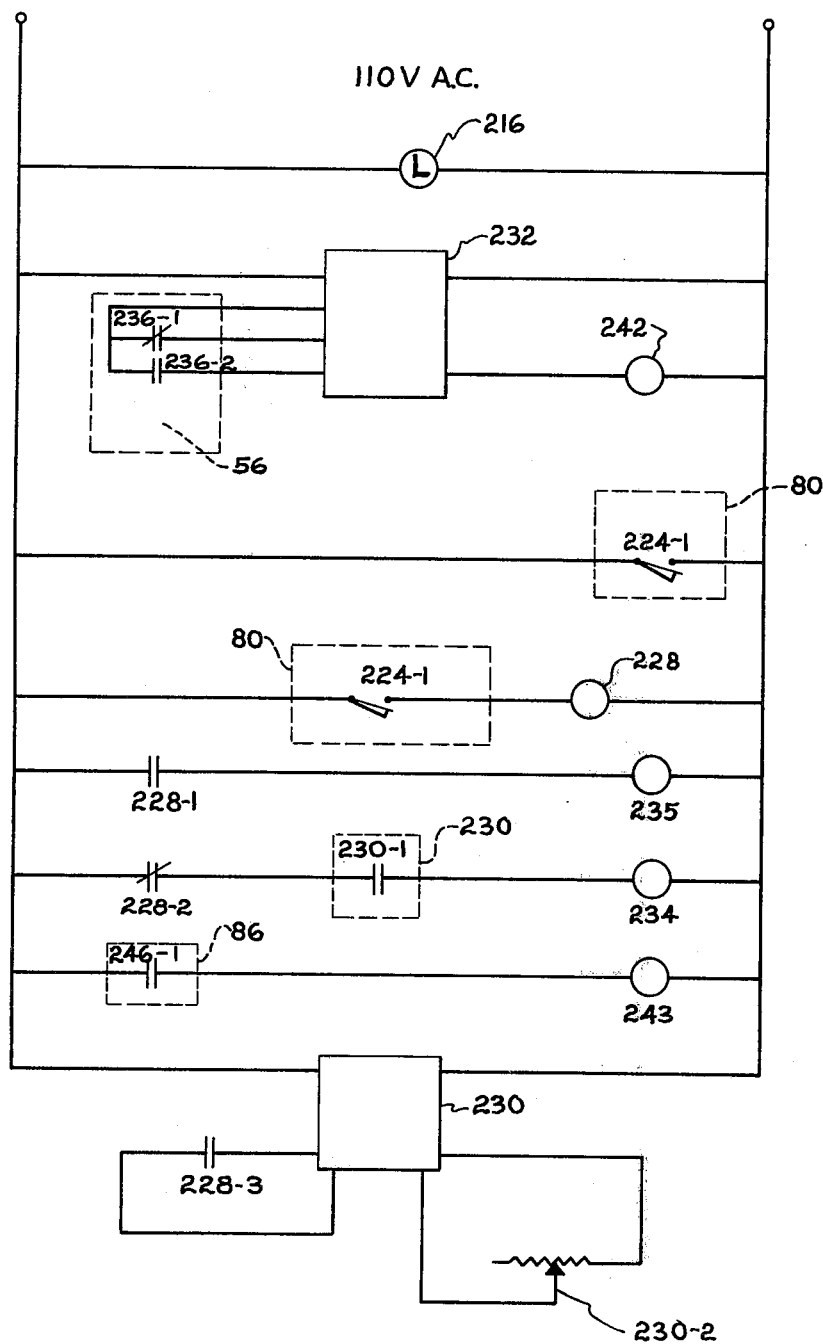

TERMINAL APPLICATOR

BACKGROUND OF THE INVENTION

Field of the Invention

The invention relates to applicators for inserting terminals into holes in a circuit board.

Description of the Prior Art

Applicators for mounting terminals on circuit boards using an extendable ram are disclosed in U.S. Pat. No. 3,307,224; U.S. Pat. No. 3,538,581; U.S. Pat. No. 3,571,924 and U.S. Pat. No. 3,605,237; wherein the terminals are carried on a strip and are fed to a cutoff or work position. A terminal applicator including an elongated pivotal feed arm is described in U.S. Pat. No. 3,797,091, wherein a spring back locating pin is positioned in a circuit board hole to assure accurate location of the hole on the axis of an extendable ram.

The terminal applicator of the present invention is distinguished from the above patents and the prior art by the retractable locating and gauging pin and surrounding actuator collar, and the terminal insertion tooling having preloaded spring fingers against the elongated insertion blade.

SUMMARY OF THE INVENTION

According to the present invention, an applicator is provided for inserting a terminal in a hole in a circuit board, comprising a frame including a base, an anvil mounted on the base, terminal insertion means mounted on the frame above the anvil, feed means mounted on the frame to one side of the terminal insertion means, and an extendable ram mounted on the frame for driving the terminal insertion means.

Preferably, the anvil includes a retractable locating pin surrounded by an actuator collar, wherein when a hole in a circuit board is positioned on the locator pin and the circuit board depressed against the surrounding actuator collar, the ram extends the terminal insertion means and the locating pin is retracted for insertion of the terminal into the circuit board hole.

Preferably, the applicator of the present invention comprises terminal insertion means including a pair of elongated, preloaded, tapered, spring fingers on either side of an elongated insertion blade connected to the extendable ram.

Preferably, control means is provided for sequentially actuating the ram and rapidly retracting the locating pin prior to insertion of a terminal into the hole in the circuit board, and to delay extending the locating pin after the ram and terminal insertion means are retracted until the circuit board hole and inserted terminal is clear of the locating pin and actuator collar.

The terminal applicator of the present invention provides for accurately and reliably locating a hole in a circuit board in axial alignment with the terminal insertion means. The locating pin pilots the hole for receiving a terminal and the surrounding collar actuates control means which extends the terminal insertion means and rapidly retracts the locating pin. This results in improved efficiency for semi-automatic operation where an operator manually locates a circuit board hole for receiving a terminal. Also, it provides for completely automatic operation, wherein the circuit board holes may be located on the pin by automatic means, e.g. numerical controls. Additionally, the precise alignment of the circuit board hole with the terminal insertion means provides for accurate insertion of the terminals and minimizes damage to the interior surfaces of the hole in the circuit board.

The applicator of the present invention is particularly useful for applying circuit board sockets of the type described in U.S. Pat. No. 3,681,738, in which, the inner legs of a M-shaped spring contact are confined within a socket body with the connecting bight portion therebetween adjacent the closed end of the body and the outer legs of the spring contact extending along the exterior of the socket body. The spring fingers which are preloaded against the insertion blade provide a significant technical advantage by securely gripping the circuit socket and positively retaining it in the proper orientation for insertion into a circuit board hole during severing of the terminal from a carrier strip and extension of the tooling. The fingers constrain the portions of the spring contact along the exterior of the socket body for insertion in the circuit board hole, and prevent the free ends of the spring from being engaged by the perimeter of the hole.

BRIEF DESCRIPTION OF THE DRAWINGS

FIG. 3 is a front view in detail of the terminal insertion means and feed means of the applicator of FIG. 1.

FIG. 3 (a) is a sectional view in detail of a drag shoe and carrier strip feed path of the terminal applicator taken along line 3a—3a of FIG. 1.

FIG. 4 is a sectional view in detail of the terminal insertion means taken along line 4—4 of FIG. 3.

FIG. 5 is a sectional view of the anvil of the terminal applicator taken along line 5—5 of FIG. 1.

FIG. 6 is a top view of the anvil of FIG. 5.

FIG. 7 is a side view in detail of the insertion tooling assembly of the terminal applicator.

FIG. 8 is a front view along line 8—8 of the tooling assembly of FIG. 7.

FIG. 9 is a sectional view of the tooling assembly along line 9—9 of FIG. 3.

FIG. 10 illustrates the insertion tooling positioning a terminal in a hole in a circuit board.

FIG. 11 illustrates the insertion of the terminal in the hole in the circuit board.

FIG. 12 illustrates an electrical schematic of the applicator of FIG. 1.

DETAILED DESCRIPTION OF A PREFERRED EMBODIMENT OF THE INVENTION

Figure 1:
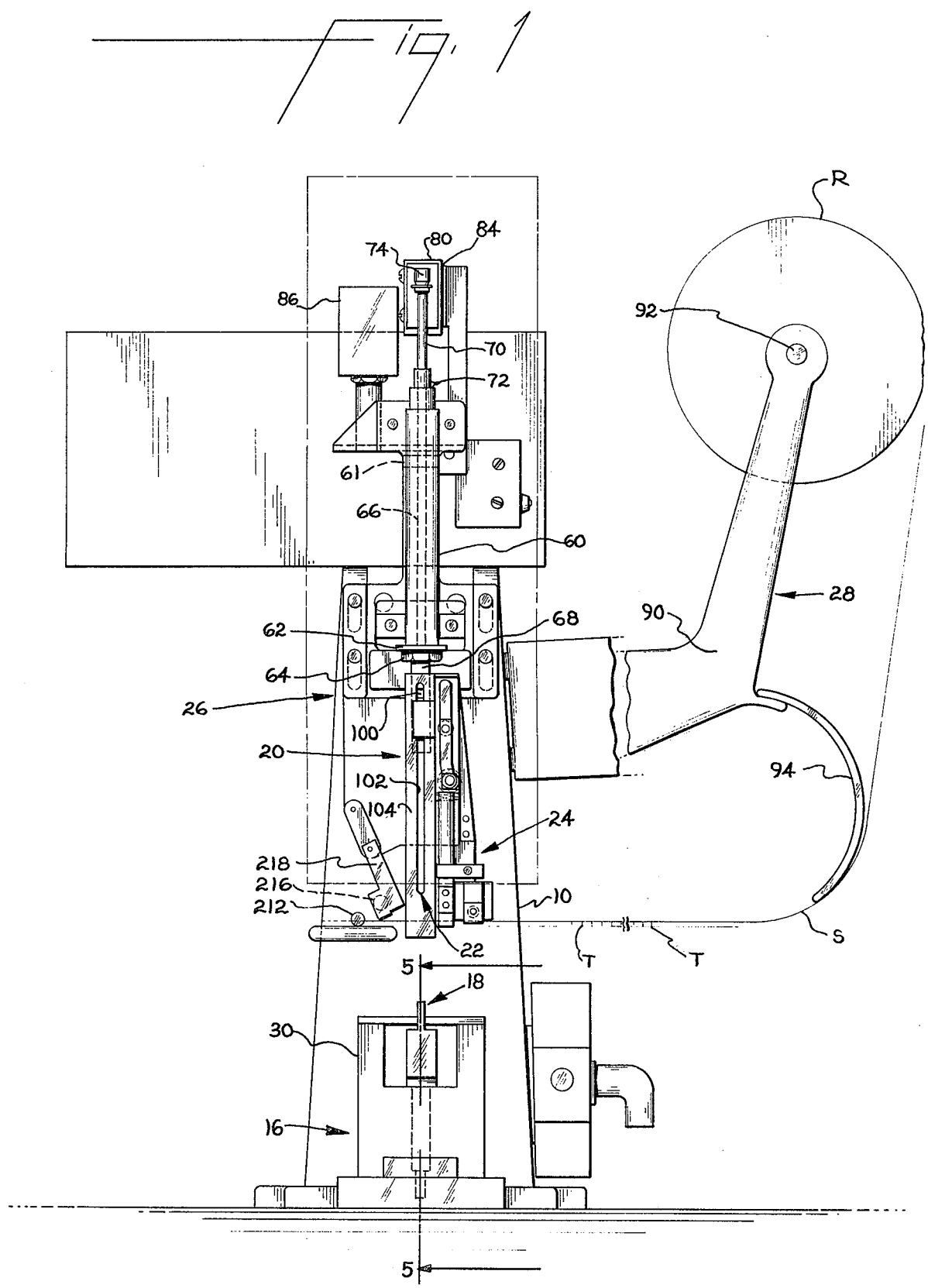
FIG. 1 is a front view of a preferred embodiment of the terminal applicator of the present invention.
Figure 2:
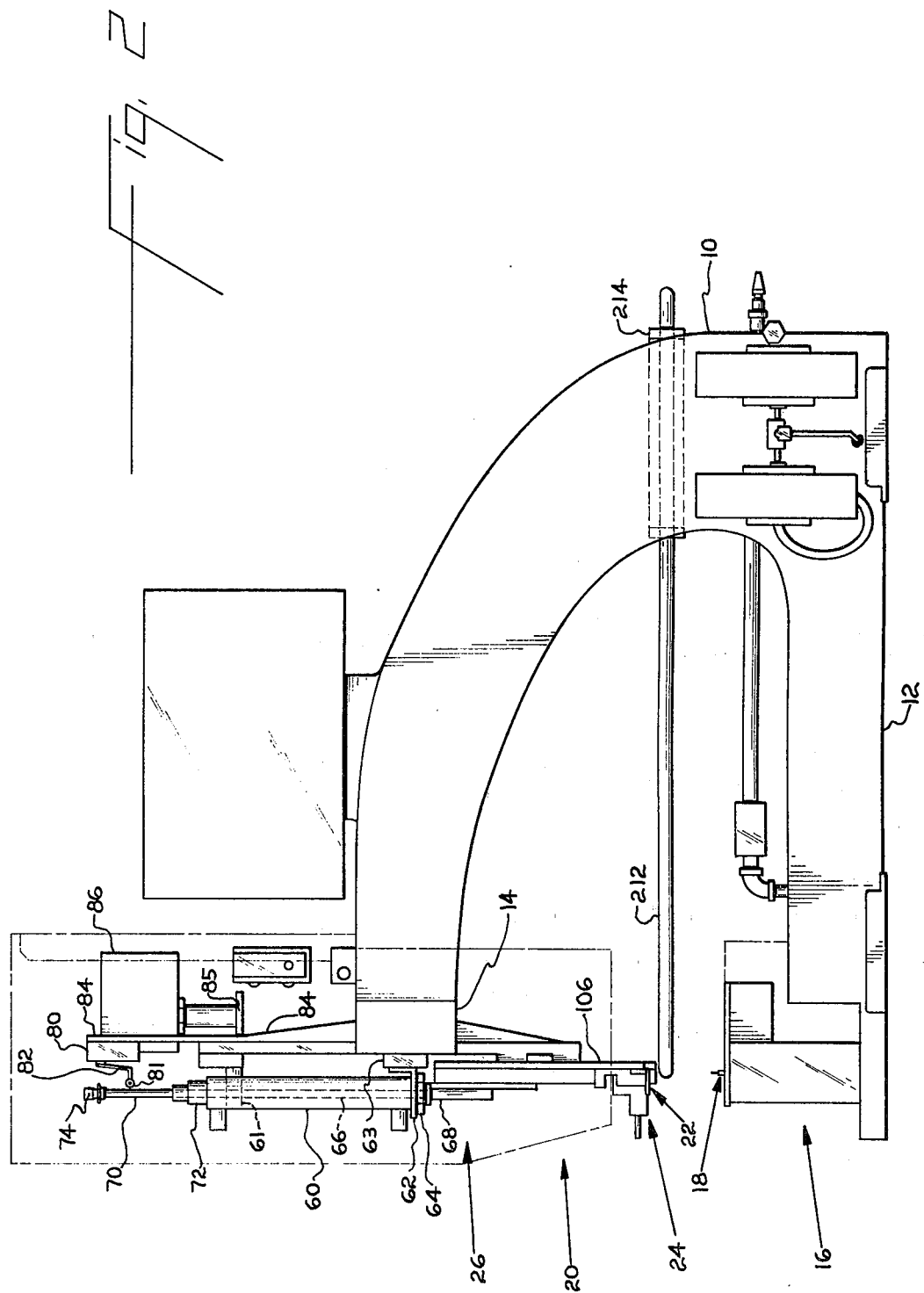
FIG. 2 is a side view of the terminal applicator of FIG. 1.

A preferred embodiment of the invention is described below with reference to the attached figures wherein the same numerals are used throughout for illustrating the same elements.

The terminal applicator of the present invention comprises a C-frame 10 including a base 12 and an upper frame arm 14. An anvil assembly 16 including a locating pin and actuator assembly 18 is mounted on the base 12 of the C-frame 10. A head assembly 20 including terminal insertion tooling 22 and feed means 24 is mounted on the frame arm 14 of the frame 10 above anvil 16. An extendable arm assembly 26 is mounted on arm 14 of the frame 10 and connected to the head assembly 20. A feed reel mounting assembly 28 is mounted on arm 14 of the frame 10.

The general operation of the terminal applicator may be readily understood with reference to FIGS. 1, 2, 10 and 11 in the attached drawings. A hole H in a circuit board B is positioned on the locating pin and actuator assembly 18 of the anvil assembly 16. Depression of the actuator assembly 18 actuates the control means which rapidly retracts the locating pin into the anvil assembly 16 and extends the ram assembly 26 connected to head assembly 20. The ram assembly 26 drives the insertion tooling downward. The insertion tooling 22 grasp terminal T, severs the terminal from the carrier strip S, and pilots and inserts the terminal T in hole H in the circuit board B. The ram assembly 26 and the insertion tooling 20 are retracted. The locating pin assembly 18 is extended. The board B is repositioned to place another hole H over the pin and actuator assembly 18. The board is depressed against the actuator and the cycle described above is repeated to insert another terminal T into another hole H in the circuit board B.

With particular reference to FIG. 5, anvil assembly block 30 is mounted on base 12 of the frame 10. The block 30 has upper and lower recesses 31 and 32 for mounting locator pin and actuator assembly 18 and air cylinder 34. Piston rod 38 connects piston 36 of air cylinder 34 to the locating pin holder 42. Pin 40 is mounted in the holder 42. A bushing 44 is mounted in upper recess 31 for guiding the pin holder 42. The actuator collar 46 is connected to a flange 48 which connects collar 46 to sleeve 50. Sleeve 50 is slidably mounted over bushing 44. A spring 52 is disposed around sleeve 50 between the flange 48 and the bottom of recess 31. The spring 52 biases the flange towards cover plate 54 mounted on block 30. Radial ribs 56 on flange 48 provide a space between the flange 50 and the bottom of the cover plate 54. The space prevents any debris from altering the height of the collar 46. The actuator collar 46 extends through a hole 55 in the cover plate 54 and surrounds the locating pin 40. Pin 40 extends up beyond the collar 46. A switch 56 is mounted on bracket 59 on the underside of cover plate 54. A switch push button 57 is positioned below flange 48 for engagement by flange 48 when the actuator collar 46 is depressed.

With particular reference to FIGS. 1, 2, 3 and 4, a ram air cylinder 60 is mounted on bracket 62 on block 63 on upper frame member 14 of frame 10. Nut 64 secures the cylinder 60 in bracket 62. Ram 68 mounted on piston rod 66 of air cylinder 60 is connected to a push block 100 in the head assembly 20. An actuator rod 70 is connected to the air piston 61 on the retraction side of air cylinder 60. A bushing 72 is provided on top of air cylinder 60 for guiding the actuator rod 70. Tooling down limit switch 80 is mounted on bracket 84 connected to arm member 14 of frame 10. A cap 74 is mounted on the end of rod 70 for engaging the roller 81 on switch arm 82. A pressure switch 86 is mounted on bracket 85 connected to bracket 84 and is pneumatically connected to the extension side of air cylinder 60.

A feed reel bracket 90 extends from the side of frame 14. Reel shaft 92 is mounted on the bracket 90 for holding a reel of terminals. A bouncer plate 94 is mounted on bracket 90 and guides a strip S of terminals T to the head assembly 20.

The head assembly 20 includes push block 100 connected to ram 68 on piston rod 66 of air cylinder 60. The push block 100 is slidably mounted in groove 101 in guide member 104 mounted on back plate 106. A slot 102 extends from groove 101 to the front of guide member 104. Back plate 106 is mounted on bracket 108 mounted on arm member 14 of frame 10.

Feed means 24 includes a feed arm 112 pivotally mounted on a pivot pin 114 on back plate 106. A spring 116 is connected between feed arm 112 and the ram guide member 104. A feed arm guide 118 is mounted on the back plate 106. A spring biased feed pawl 122 is mounted on shaft 119. Spring 120 on shaft 119 biases the feed pawl and is retained on the shaft by spring retainer block 123. A strip guide plate 126 is connected to back plate 106. Groove 128 in guide plate 126 receives a strip S of terminals T, and provides a path for feeding the terminals T to an insertion station. A feed guide plate 127 is mounted on the bottom of guide plate 126. A spring biased drag shoe 132 is mounted on shaft 133 mounted in block 130 on guide plate 126. Spring 134 is provided on shaft 133 and retained by spring retainer block 136. Knurled ends 138 are provided on shafts 119 and 133. A box cam 140 having cam slot 142 is mounted to the push block 100. An eccentric shaft 144 on the feed arm 112 is disposed in cam slot 142. Nut 146 locks the rotated position of eccentric shaft 144 in cam slot 142 on feed arm 112.

With particular reference to FIGS. 7, 8, 9, 10 and 11, the insertion tooling assembly 22 includes mount 150, an elongated shear blade 152 and a pair of tapered, spring fingers 154 and 156. Each spring finger 154, 156 is preloaded against the shear blade 152. The shear blade 152 has a base 158 with a pair of spaced cross members 160 and 162. Shaft 164 extends from the base 158 of the shear blade 152 between fingers 154, 156. A widened section 166 is provided on the free end 168 of shaft 164 of shear blade 152. The face of section 166 has a groove 170 spaced inwardly from the cutting edge 172. The shear blade 152 is fixedly connected to push block 100 by cross member 160 which is received by slots 174 in the block 100. Mount 150 is connected to the block 100 through the cross member 162 of the shear blade 152 which is received in slots 175 of mount 150. Slots 175 are wider than cross member 156. Spring 176 in recess 178 of the mount 150 and recess 179 of the push block 100 biases the mount 150 away from the block 100. Tabs 180, 181 in mount 150 engage slots 182, 183 in the bases 184, 185 of each finger and fixedly mount fingers 154 and 156 to the mount 150. The spring fingers are overloaded, and in the absence of preloading against the shear blade shaft 164 of widened section 166 of shear blade 152, the fingers 154, 156 engage each other when mounted in mount 150. The ends 192, 194 of each of the fingers 154, 156 include longitudinal recesses 186, 187 and, respectively, cam surfaces 188, 190 spaced inward from each end 192, 194 for engagement by the widened section 166 of shear blade 152 and spreading the fingers 154, 156 during insertion of the terminal. Lateral rectangular recess 196, 198 are provided on each end 192, 194 of each finger 154, 156 to provide for receiving the terminals T and securing them on four sides. The mount 150 has a tongue member 200 which is slidably received in slot 102 of guide member 104. An adjustable stop member 202 may be provided in tongue 200 for engaging the end of slot 102 and adjusting the extension stroke of mount 150, insertion member 152, and fingers 154 and 156.

A shear plate 210 is mounted beneath cutting edge 172 of shear blade 166 on strip guide plate 126.

A scrap tube 212 is mounted in holder 214 mounted on base 10. A locator light 216 is mounted on bracket 218 connected to frame 14.

Figure 13:
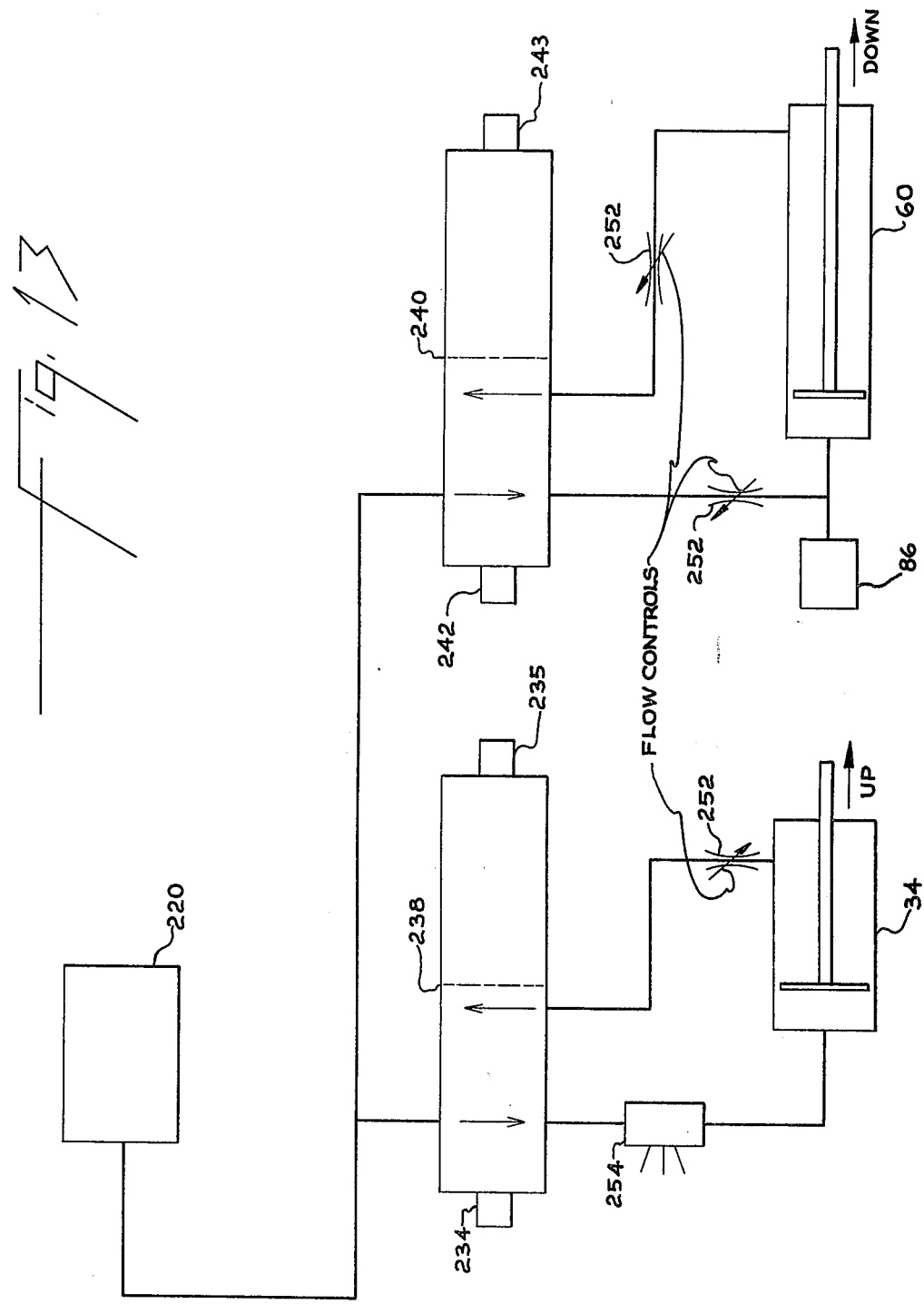
FIG. 13 illustrates a pneumatic schematic of the applicator of FIG. 1.

The detailed operation of the apparatus of the invention can be readily understood with reference to the drawings, particularly the electrical and pneumatic schematics of FIGS. 12 and 13, and the description which follows.

A strip S of terminals T is supplied from reel R mounted on shaft 92. Strip S is guided around the bouncer plate 94 and threaded through groove 128 of the strip guide plate 126. The carrier strip S with the terminals T attached thereto is threaded under drag shoe 132, feed pawl 122 and into the scrap tube 212.

A circuit board B having a hole H for receiving a terminal T is manually positioned over anvil assembly 16. The hole H is placed over the locator pin 40. The board is depressed against collar 46. The collar 46 is moved downward, and flange 48 engages push button 57 of switch 56 switching form C contacts 236-1 and 236-2 connected to the input of multi-vibrator 232. An output signal from the multi-vibrator 232 energizes solenoid 242. Solenoid 242 shifts four-way air pilot valve 240 to connect the regulated air source 220 to the extension side of ram air cylinder 60, and vent the retraction side of cylinder 60. Actuator rod 70 connected to the air piston 61 of air cylinder 60 engages the actuator cap 74 with roller 81 on switch arm 82 of limit switch 80. The normally open contact 224-1 of limit switch 80 is closed energizing relay 228. Normally open contact 228-1 of relay 228 energizes solenoid 235 which switches four-way air pilot valve 238 to connect the regulated air source 220 to the retraction side of air cylinder 34 and vent the extension side of air cylinder 34. The locating pin 40 is rapidly retracted by air cylinder 34 in a race with the push block 100 which is driven downward by ram air cylinder 60. The push block 100 drives the insertion tool assembly 22 and the box cam member 140 downward. Preloaded, spring fingers 154 and 156 snap over the spring on either side of the terminal T. The cutting edge 172 of the shear blade 152 engages the section of the carrier strip S connected to the terminal T against the shear plate 210 severing the terminal T from the carrier strip S. The terminal retainer spring fingers 154 and 156 hold terminal T in alignment with the hole H in the circuit board B. When air cylinder 60 is fully extended the terminal T is positioned into the hole H after the pin 40 has been retracted. The spring loaded amount 150 and fingers 154 and 156 are stopped when stop member 202 engages the end of slot 104.

The slot 168 in the face of shear blade 152 receives the springs on the terminal T and the face of the blade engages the rim of the terminal to avoid damage to the springs. The insertion member 152 which is fixedly connected to the push block 100 extends the widened section 166 of shear blade 152 and engages against cam surfaces 188, 190 to spread spring fingers 154 and 156 and seat the terminal T into the hole H.

Pressure switch 86 connected to air cylinder 60 is closed when the ram is fully extended and the shear blade 152 has inserted the terminal T in hole H. The shaft 144 disposed in cam slot 142 of the box cam 140 pivots the feed arm 112 drawing the feed pawl 122 back along the carrier strip S and engages a subsequent pilot hole in the carrier strip S.

Pressure switch 86 closes normally open contact 246-1 and energizes solenoid 243. Solenoid 243 shifts four-way air pilot valve 240 to connect the regulated air source 220 to the retraction side and vent the extension side of air cylinder 60. Ram air cylinder 60 retracts the push block 100 and the tooling 22 and box cam 140. Cam slot 142 advances feed arm 112 and feed pawl 122 feeds another terminal T to the insertion station in axial alignment with the insertion tooling 22. Cap 74 on actuator rod 70 connected to air piston 61 of air cylinder 60 disengages switch arm 82 of limit switch 80 opening normally open contact 224-1 and deenergizing relay 228. Timer 230 which is started by switching normally open contact 228-3 of relay 228 delays extension of locator pin 40 until contact 230-1 closes and through contact 228-2 energizes solenoid 234. Solenoid 234 shifts four-way air pilot valve 238 to connect the air source 220 to the extension side of air cylinder 34 and vent the retraction side of the air cylinder 34. The timer 230 is adjusted by potentiometer 230-2 to provide a sufficient time lapse, between the retraction of tooling 22 and the extension of the locator pin 40, to enable an operator to lift the board clear of the anvil assembly 16.

Flow control valves 252 are provided in the air lines on the extension side and retraction side of air cylinder 60 and the retraction side of air cylinder 34. A dump valve 254 is provided in the air line to the extension side of air cylinder 34 to provide rapid exhaust of the air from the retraction side and insure the locator pin is retracted more rapidly than the extension of the insertion tooling.

The terminal applicator of the present invention can be readily adapted for inserting various sizes and shaped electrical terminals into holes in a circuit board. While the above-descriptioned and attached drawings illustrate a preferred embodiment of the applicator of the invention, it is apparent that other embodiments and modifications are equivalent and will be apparent to one skilled in the art; therefore the invention is not to be limited except by the appended claims.

We claim:

1. An apparatus for applying a terminal into a hole in a circuit board, comprising;
    a frame,
    an anvil mounted on said frame for receiving a circuit board, said anvil including a retractable pin for locating a hole in a circuit board and an actuator member adjacent said pin for engagement by the circuit board when the hole is located on said pin,
    means mounted on said frame for inserting the terminal into a hole in the circuit board, said means including an elongated insertion member and tapered spring terminal holding fingers preloaded against each side of said member for gripping and positioning a terminal in axial alignment with the hole in the circuit board and said pin,
    means for extending toward said anvil said means for inserting the terminal into the hole in the circuit board,
    means for retracting said locating pin, and
    control means actuatable by moving the circuit board against said actuator member adjacent said pin for retracting said pin from the hole in the circuit board and for extending said means for inserting the terminal into the hole in the circuit board.

2. An apparatus, as recited in claim 1, wherein said control means retracts said locating pin more rapidly than the means for inserting the terminal is extended.

3. An apparatus, as recited in claim 1, wherein said control means delays extension of said retractable pin a period of time for removal of the circuit board from the anvil.

4. An apparatus, as recited in claim 1, wherein said insertion member includes a widened shear blade on a free end thereof for spreading said preloaded spring fingers during insertion of the terminal into the hole.

5. An apparatus, as recited in claim 1, wherein said actuator member comprises a collar surrounding said locator pin.

6. An apparatus for applying a terminal into a hole in a circuit board, comprising:
a frame,
an anvil mounted on said frame for receiving a circuit board, said anvil including a retractable pin for locating a hole in a circuit board and an actuator member adjacent said pin for engagement by the circuit board when the circuit board is located on said pin,
means mounted on said frame for inserting a terminal into a hole in a circuit board in axial alignment with said pin,
means for extending said means for inserting the terminal in the hole in the circuit board toward said anvil,
means for retracting said pin, and
control means actuatable by moving the circuit board against said actuator member adjacent said pin for retracting said pin from the hole in said circuit board more rapidly than extending said means for inserting said terminal and positioning a terminal into the hole in the circuit board.

7. An apparatus, as recited in claim 6, wherein said control means delays extension of said retractable pin a period of time for removal of the circuit board from the anvil.

8. An apparatus, as recited in claim 6, wherein said actuator member comprises a collar surrounding said locator pin.

9. An apparatus, as recited in claim 6, wherein said anvil additionally comprises a plate having an opening therein for said pin and said actuator member, and said actuator member is connected to a flange which is spring loaded against the underside of said plate.

10. An apparatus, as recited in claim 9, additionally comprising means for providing a space between said flange and the underside of said plate for permitting egress of debris from between said flange and said underside of said plate.

11. An apparatus, as recited in claim 10, wherein said means for providing a space comprises a plurality of radial ribs on said flange.

12. An appratus for applying a terminal in a hole in a circuit board, comprising;
a frame,
means mounted on said frame for receiving a circuit board,
means mounted on said frame for inserting a terminal in a hole in the circuit board including an elongated insertion member and a pair of tapered, spring fingers, each finger on the side of and preloaded against said member for holding and positioning a terminal in axial alignment with one hole in the circuit board, and
means for extending said means for inserting the terminal in the hole in the circuit board.

13. An apparatus, as recited in claim 12 additionally comprising means for feeding a plurality of terminals attached to a carrier strip to an insertion station in axial alignment with said means for inserting the terminal in a hole in the circuit board.

14. An apparatus, as recited in claim 12, wherein said insertion member includes a widened shear blade on the free end thereof for spreading the preloaded spring fingers duing insertion of the terminal into the hole.

15. An apparatus, as recited in claim 14, wherein each of said spring fingers includes a longitudinal recess having a cam surface, and said widened shear blade engages said cam surface to spread said fingers for insertion of the terminal in the circuit board.

16. An apparatus, as recited in claim 9, wherein said elongated insertion member is fixedly connected to said means for extending said means for inserting the terminal and said fingers are slidably mounted to said means for inserting the terminal, and said insertion member is extendable between said spring fingers.

17. An apparatus, as recited in claim 16, wherein said slidably mounted spring fingers are spring loaded against said means for extending said means for inserting the terminal.

18. A method for positioning a hole in a circuit board for receiving a terminal, comprising the steps of
positioning the hole in the circuit board over a locating pin,
depressing the circuit board against an actuator member adjacent the locating pin,
retracting the locating pin from the hole in the circuit board to vacate the hole,
inserting a terminal into the vacated hole in the circuit board.

19. A method, as recited in claim 18, additionally comprising the steps of
lifting the circuit board clear of the actuator member, and
extending the locating pin for positioning another hole in the circuit board over said locating pin.

* * * * *